(12) United States Patent
Kim et al.

(10) Patent No.: US 7,414,429 B1
(45) Date of Patent: Aug. 19, 2008

(54) INTEGRATION OF HIGH-SPEED SERIAL INTERFACE CIRCUITRY INTO PROGRAMMABLE LOGIC DEVICE ARCHITECTURES

(75) Inventors: In Whan Kim, Newark, CA (US);
Sergey Shumarayev, San Leandro, CA (US); Tim Tri Hoang, San Jose, CA (US); Wilson Wong, San Francisco, CA (US); Thungoc M. Tran, San Jose, CA (US)

(73) Assignee: Altera Corporation, San Jose, CA (US)

( * ) Notice: Subject to any disclaimer, the term of this patent is extended or adjusted under 35 U.S.C. 154(b) by 76 days.

(21) Appl. No.: 11/486,867

(22) Filed: Jul. 14, 2006

Related U.S. Application Data

(60) Provisional application No. 60/701,119, filed on Jul. 19, 2005.

(51) Int. Cl.
*G06F 7/38* (2006.01)
*H03K 19/173* (2006.01)
*H03K 19/177* (2006.01)
*H03K 19/0175* (2006.01)
*H01L 25/00* (2006.01)

(52) U.S. Cl. .............................. 326/41; 326/37; 326/38; 326/39; 326/40; 326/62

(58) Field of Classification Search ............. 326/37–50, 326/62–92
See application file for complete search history.

(56) References Cited

U.S. PATENT DOCUMENTS

| | | | |
|---|---|---|---|
| 6,650,141 B2 * | 11/2003 | Agrawal et al. | 326/41 |
| 6,813,579 B1 * | 11/2004 | Meyer | 702/120 |
| 6,975,140 B2 * | 12/2005 | Hsu et al. | 326/82 |
| 2002/0190751 A1 * | 12/2002 | Lee et al. | 326/39 |
| 2005/0200390 A1 | 9/2005 | Starr et al. | |

* cited by examiner

*Primary Examiner*—Rexford Barnie
*Assistant Examiner*—Matthew C Tabler
(74) *Attorney, Agent, or Firm*—Ropes & Gray LLP; Robert R. Jackson

(57) ABSTRACT

The architecture of a programmable logic device ("PLD") is modified in one or more of several respects to facilitate inclusion of high-speed serial interface ("HSSI") circuitry in the PLD. For example, the HSSI circuitry is preferably located along one side of the device, taking the place of regular peripheral IO circuitry in that area. Certain portions of the core logic circuitry are modified to better interface with the HSSI circuitry.

22 Claims, 9 Drawing Sheets

INTEGRATION OF HIGH-SPEED SERIAL INTERFACE CIRCUITRY INTO PROGRAMMABLE LOGIC DEVICE ARCHITECTURES

This application claims the benefit of U.S. provisional patent application No. 60/701,119, filed Jul. 19, 2005, which is hereby incorporated by reference herein in its entirety.

BACKGROUND OF THE INVENTION

This invention relates to programmable logic devices ("PLDs"), and more particularly to inclusion of high-speed serial interface circuitry in PLDs.

PLDs are relatively general-purpose devices that are manufactured to meet the various needs of many different potential users. The broader the range of needs that a PLD can satisfy, the larger the potential market for the PLD. A large volume of sales helps to hold down or reduce the unit cost of the PLD. Of course, adding more features to the PLD puts upward pressure on unit cost. So there is a trade-off between giving the PLD too few features to make it widely marketable, and giving it so many features that it becomes too expensive.

An area of recent interest in PLD design is the inclusion of high-speed serial interface ("HSSI") circuitry. Different users may want to use HSSI circuitry in many different ways. For example, there are many different industry-standard protocols for high-speed serial communication ("HSSC"). A user may want to use any of those industry-standard protocols. Or a user may want to use the user's own custom protocol.

Typically what is done in HSSC is to send and/or receive one or more channels or lanes of high-speed serial data. For example, each channel may operate in the gigahertz range (i.e., at a data rate in the range from approaching 1 GHz to several GHz). (Particular frequencies mentioned herein are only illustrative, and the invention is equally applicable to other lower or higher frequencies.) Some users may want to use one or more HSSI transmitter and/or receiver channels individually. Other users may want to use multiple HSSI transmitter and/or receiver channels in parallel (e.g., four channels operating together, eight channels operating together, etc.). "Operating together" typically means that there is some synchronization among the channels thus operating together. A user of channels operating together may want to use multiple instances of such channel groups.

To support such a wide range of possible HSSI use, a substantial amount of HSSI circuitry may need to be included on a PLD. And because of the possible need for synchronization among some or all of the channels of such HSSI circuitry, it may be preferable to provide this circuitry in a concentrated area or location on the PLD. Accommodating such a large amount of HSSI circuitry in a concentrated area may warrant innovative modifications to known PLD architectures.

SUMMARY OF THE INVENTION

In accordance with this invention, any one or more of a number of architectural features may be employed to facilitate the inclusion of HSSI circuitry in a PLD. The HSSI circuitry may be concentrated along a side of the programmable logic array circuitry of the PLD. Each channel of HSSI transceiver circuitry may communicate with respective row(s) of logic in the logic array. The rows that communicate with HSSI channels may be enhanced for that communication by having more buffers for driving interconnection conductors of the row adjacent the channel than at the opposite end of the row remote from the channel. Test pins that would normally serve test circuitry that is located on the side of the device having the HSSI circuitry may be relocated to the opposite side of the device. Those relocated test pins may be connected to their normal test circuitry by conductors that pass over the intervening logic array circuitry. These conductors may include buffers. Certain circuits and/or circuit functions (e.g., on-chip termination calibration control and center clock circuitry) may be relocated from logic array rows that interface with HSSI channels to rows that do not interface with such channels. Certain kinds of peripheral circuitry (e.g., LVDS (low-voltage differential signaling) clock tree circuitry and SERDES/DPA (serializer-deserializer/digital phase alignment) circuitry) may be omitted from the side of the device having HSSI circuitry. Modified redundancy circuitry may be provided on the side of the device having HSSI circuitry. Peripheral JTAG scan chains may be provided where the device does not have HSSI circuitry, but not where the device does have HSSI circuitry.

Further features of the invention, its nature and various advantages, will be more apparent from the accompanying drawings and the following detailed description.

DETAILED DESCRIPTION

Figure 1:
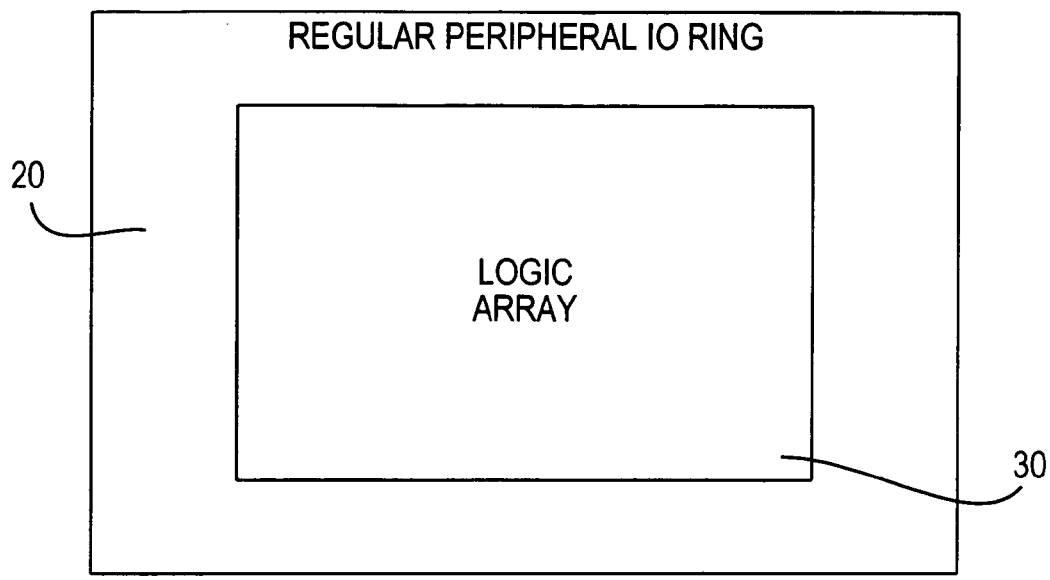
FIG. 1 is a simplified plan view of a conventional programmable logic device ("PLD").

An illustrative known architecture (overall organization) for a PLD 10 is shown in FIG. 1. As shown in this FIG., PLD 10 includes programmable logic array circuitry 30 surrounded by a ring 20 of what is called regular peripheral IO. There can be many different types of IO resources in ring 20. Examples include test pins, programming pins, memory interface, regular data inputs and outputs, regular clock inputs and outputs, etc.

Figure 2:
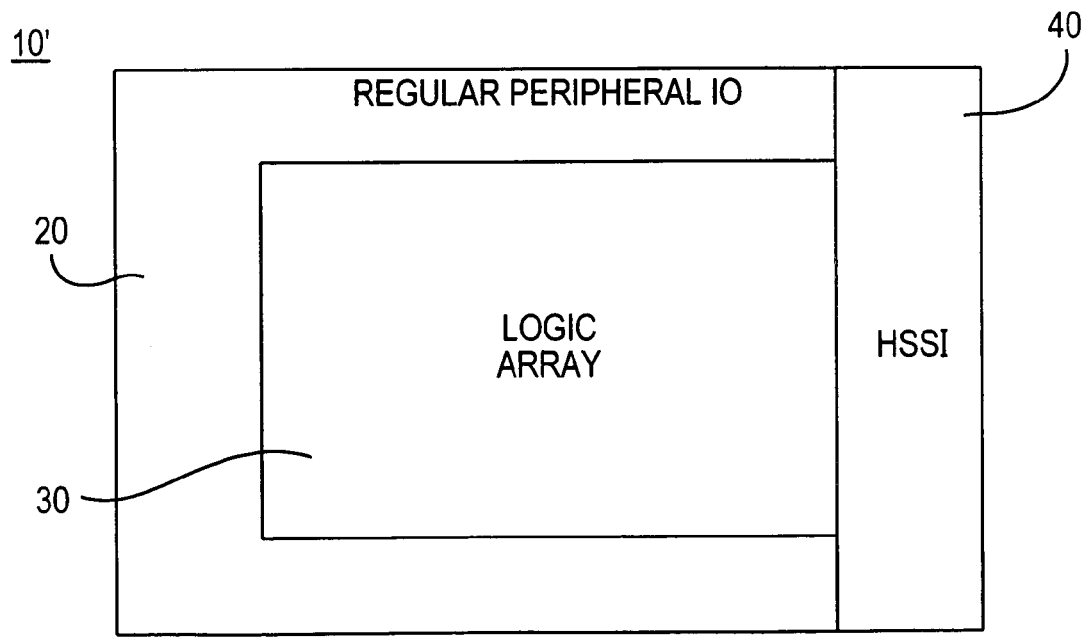
FIG. 2 is an illustrative embodiment of a modification of FIG. 1 in accordance with the invention.

FIG. 2 shows an illustrative modification of the FIG. 1 circuitry in accordance with this invention to include HSSI circuitry 40. In accordance with the invention, HSSI circuitry 40 is preferably located along one side (in this example, the right side) of modified PLD 10'. In this embodiment HSSI circuitry 40 takes the place of most or all of the regular peripheral IO circuitry along the right side of PLD 10'. This arrangement and location of HSSI circuitry 40 is selected for several reasons. For one thing, it is desirable to keep HSSI circuitry 40 together along one side of PLD 10' because (as will be shown in more detail later in this specification) this facilitates sharing of signals among the several portions of the HSSI circuitry. Such shared signals may include clock signals, whose timing at various destination circuits may be important to proper operation (e.g., synchronization) of various parts of the HSSI circuitry. Having HSSI circuitry 40 thus disposed on PLD 10' in a compact arrangement can be beneficial from this type of standpoint.

Figure 4:
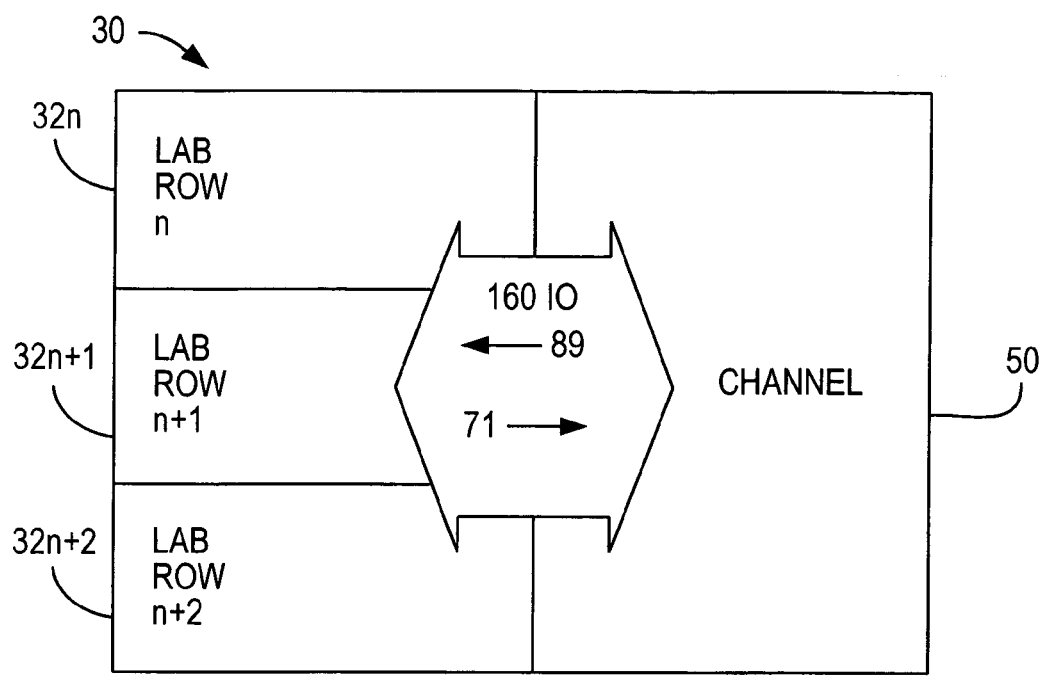
FIG. 4 shows a representative portion of an illustrative embodiment like those of FIGS. 2 and 3 in more detail.
Figure 5:
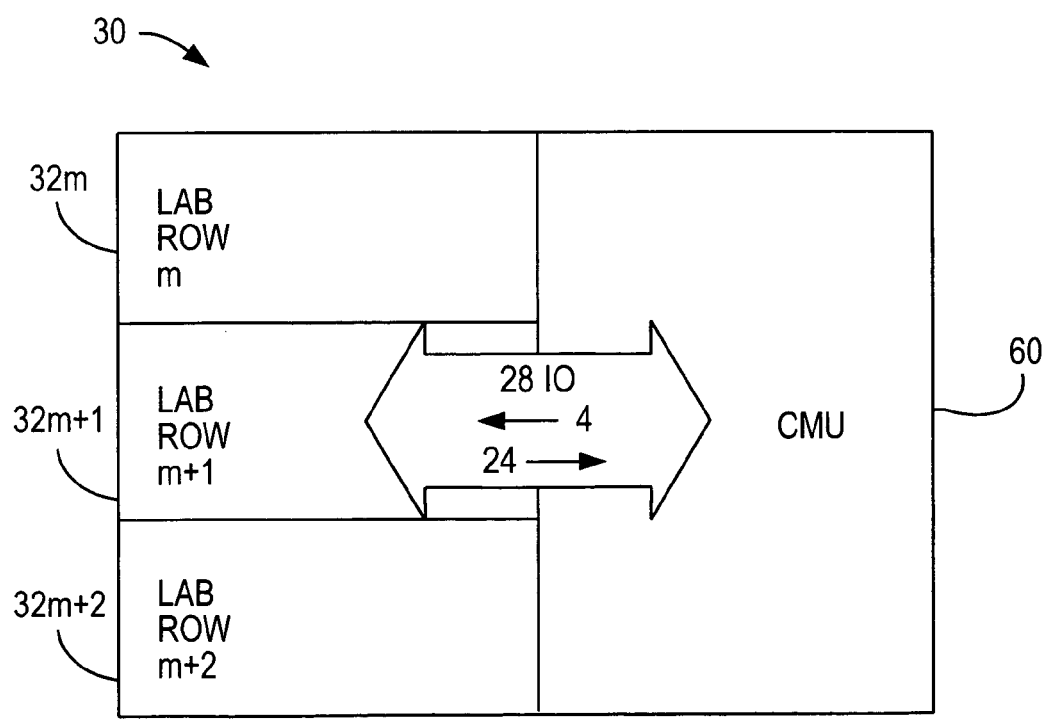
FIG. 5 is similar to FIG. 4 for another representative portion of the FIG. 4 embodiment.

Locating HSSI circuitry 40 along the left or right side of PLD 10' can be desirable because horizontal routing resources in logic array 30 may be somewhat more flexible and somewhat more easily enhanced than vertical interconnection resources in the logic array. Also, as will be seen from FIGS. 4 and 5, certain units of HSSI circuitry 40 register relatively well (physically) in the vertical direction with rows of logic in logic array 30. This facilitates interfacing between various units of HSSI circuitry 40 and various rows of logic in logic array 30. This point will be better appreciated when FIGS. like FIGS. 4 and 5 are discussed in more detail later in this specification.

In the particular example shown in FIG. 2 HSSI circuitry 40 is located on the right side of PLD 10' because the starting PLD architecture 10 has no programming pins and no memory interface circuitry on the right side.

Figure 3:
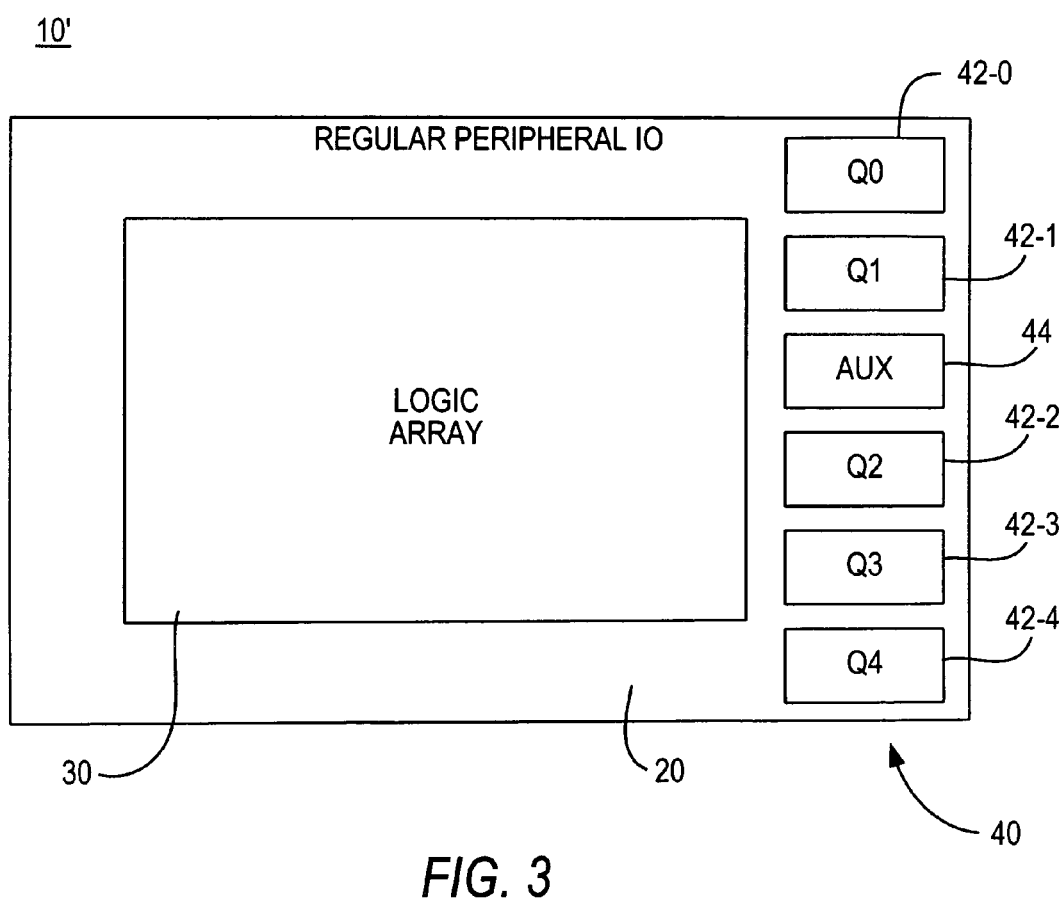
FIG. 3 shows an illustrative embodiment like that of FIG. 2 in somewhat more detail.

An illustrative embodiment of HSSI circuitry 40 is shown in more detail in FIG. 3. In this embodiment HSSI circuitry 40 includes five "quads" 42-0 through 42-4 (or Q0-Q4) of HSSI circuitry and auxiliary ("AUX") circuitry 44. Each quad 42 includes four channels of HSSI circuitry and clock multiplier unit ("CMU") circuitry (see FIG. 4, which shows one representative channel 50 of HSSI circuitry, and FIG. 5, which shows one representative instance of CMU circuitry 60). Each channel 50 includes receiver circuitry for one high-speed serial input signal and transmitter circuitry for one high-speed serial output signal. Each instance of CMU circuitry 60 includes circuitry such as one or more phase-locked loop ("PLL") circuits, clock signal frequency multiplier and/or divider circuits, and the like that can be shared by the various channels 50 in the quad 42 that includes that CMU circuitry and possibly also other channels in other quads 42.

AUX circuitry 44 is a calibration block that is designed to control the impedance of RX (receiver) and TX (transmitter) termination resistance. Unlike earlier products such as the Altera Corporation Stratix GX product, in which each HSSI quad had its own calibration, architectures of the type shown and described herein preferably have one calibration block for all channels. This calibration block is placed in AUX slice 44.

It will be understood that the number of quads 42 shown in FIG. 3 is only illustrative, and that HSSI circuitry 40 can include a larger or smaller number of quads than is shown in the FIG. 3 example.

FIGS. 4 and 5 show that each HSSI channel 50 and each instance of HSSI CMU 60 can advantageously approximately line up with several rows of the logic array blocks ("LABs") 32 in logic array 30. FIG. 4, for example, shows that each channel 50 can line up with a respective three rows of LABs 32n, 32n+1, and 32n+2. FIG. 5 shows that each CMU 60 can line up with a respective three rows of LABs 32m, 32 m+1, and 32 m+2. There can be additional rows of LABs 32 between the LAB rows that line up with channels 50 and CMUs 60.

FIG. 4 shows that each channel 50 needs a large number of connections to and/or from logic array 30. For example, FIG. 4 shows a total of 160 such connections for a typical channel. In this example, there are 89 inputs from channel 50 to logic array 30, and 71 outputs from logic array 30 to channel 50. FIG. 4 further shows that these inputs and outputs are distributed among the three LAB rows 32n, 32n+1, and 32n+2 that are associated with the depicted representative channel 50. The large number of input signals (89 in this example) includes many parallel data signals (because one of the tasks performed by a channel 50 may be to convert the high-speed serial input signal to many parallel data signals at much lower clock rates), clock signals, status signals, test-related signals, etc. Similarly, the large number of output signals (71 in this example) includes many parallel data signals (because one of the tasks performed by a channel 50 may be to convert many parallel data outputs from logic array 30 at a relatively low clock rate to one high-speed serial output signal of PLD 10'), clock signals, control signals, etc.

Again, the many inputs and outputs of the representative channel 50 shown in FIG. 4 are preferably distributed among the three LAB rows 32n, 32n+1, and 32n+2 that are respectively associated with that channel. This is done to avoid congestion that might otherwise result from trying to interface each channel 50 with a smaller portion of the routing and/or logic resources of logic array 50.

It will be understood that the number of channel 50 interface connections shown in FIG. 4 (i.e., 160 such connections) is only an example, and that this number can be more or less than 160 in other embodiments in accordance with the invention.

FIG. 5 shows that although each instance of CMU 60 physically lines up with a respective three LAB rows 32m, 32m+1, and 32m+2, the logic array interface requirements of a CMU are much less than those of a channel 50 and can be satisfied by connections to only one of the adjacent LAB rows (32m+1 in this example). In particular, FIG. 5 shows all 28 inputs and outputs of CMU 60 connected to aligned LAB row 32m+1. No connections are needed to aligned LAB rows 32m and 32m+2. Reference clock signals are an example of what may be among the four inputs from CMU 60 to LAB row 32m+1. Control signals are an example of what may be among the 24 outputs from LAB row 32m+1 to CMU 60.

Again, it will be understood that the 28 IOs shown in FIG. 5 are only illustrative, and that this number can be different in other embodiments in accordance with the invention.

Figure 6:
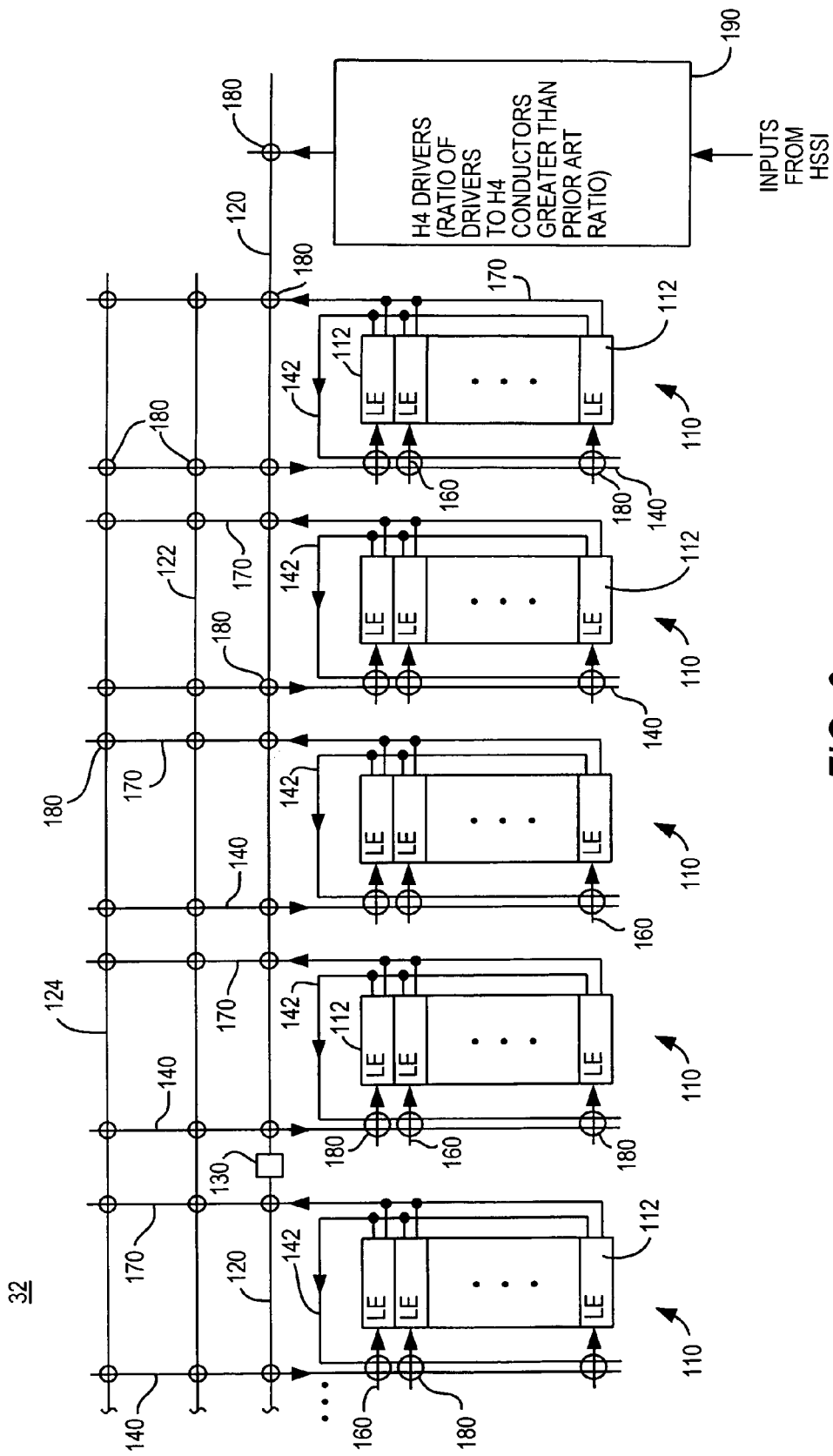
FIG. 6 is a simplified schematic block diagram of a representative portion of an illustrative embodiment of a possible aspect of the invention.

FIG. 6 shows a portion of a typical LAB row 32 that is aligned with an HSSI channel 50 (e.g., like any of LAB rows 32n, 32n+1, and 32n+2 in FIG. 4). LAB row 32 includes the following elements: a row of LABs 110, each including a plurality of logic elements ("LEs") 112; horizontal interconnection conductors of several different lengths such as H4 conductors 120 (spanning four LABs 110), H8 conductors 122 (spanning eight LABs 110), and H16 conductors 124 (spanning 16 LABs 110); programmable interconnections 130 for selectively stitching together axially adjacent conductors (such as axially adjacent H4 conductors 120) to make longer conductors); LAB-feeding conductors 140 for bringing selected signals from conductors 120/122/124 into each LAB 110; local feedback conductors 142 for feeding outputs of the LEs 112 in a LAB 110 back to inputs of that LAB; LE-feeding conductors 160 for applying selected signals from the conductors 140/142 associated with a LAB 110 to the LEs 112 of that LAB; LE output conductors 170 for applying output signals of LEs 112 to selected conductors 120/122/124; and programmable interconnections 180 for making connections between conductors that intersect at the locations of those interconnections. It will be understood that FIG. 6 is simplified and that many other generally similar architectures are equally possible. For example, FIG. 6 omits vertical, inter-row, interconnection resources that are also present, but that are not particularly germane to this embodiment of the invention and that would unduly complicate the drawing if added.

FIG. 6 also shows that there are drivers 190 for applying output signals of the aligned HSSI channel 50 to H4 conductors 120. FIG. 6 shows that the number of these H4 drivers 190 relative to the number of H4 conductors is increased in accordance with this invention as compared to the number of such drivers in prior architectures. This is done in order to ease the routing congestion created by a large number of HSSI signals talking to the PLD fabric (e.g., 160 signals from each HSSI channel 50 interfacing with a respective three LAB rows as shown in FIG. 4).

Although FIG. 6 describes the ratio of drivers 190 to H4 conductors 120 as greater than in the prior art, another way to describe this aspect of the invention is to note that the ratio of drivers 190 to H4 conductors 120 at the end of a LAB row interfacing with an HSSI channel 50 is greater than the ratio of H4 drivers to H4 conductors 120 at the other end (i.e., the regular peripheral IO end) of that LAB row. A possible variation in terminology is to refer to conductor tracks rather than conductors. Thus, for example, an H4 conductor track may extend across an entire LAB row 32 and be occupied by several axially aligned H4 conductor segments. The ratios referred to above may then be alternatively described as ratios of H4 conductor drivers to H4 conductor tracks.

Although FIG. 6 specifically shows only drivers 190 from HSSI to H4 conductors 120, the circuitry may allow drivers from HSSI to get onto other routing resources of the device. For example, if the device has H4, V4, H24, and V16 conductors, the drivers from HSSI may allow connection(s) to all of those routing resources. (H, of course, stands for horizontal and V stands for vertical, and the numbers 4, 16, and 24 indicate how many LABs an H or V conductor passes adjacent to.)

Figure 7:
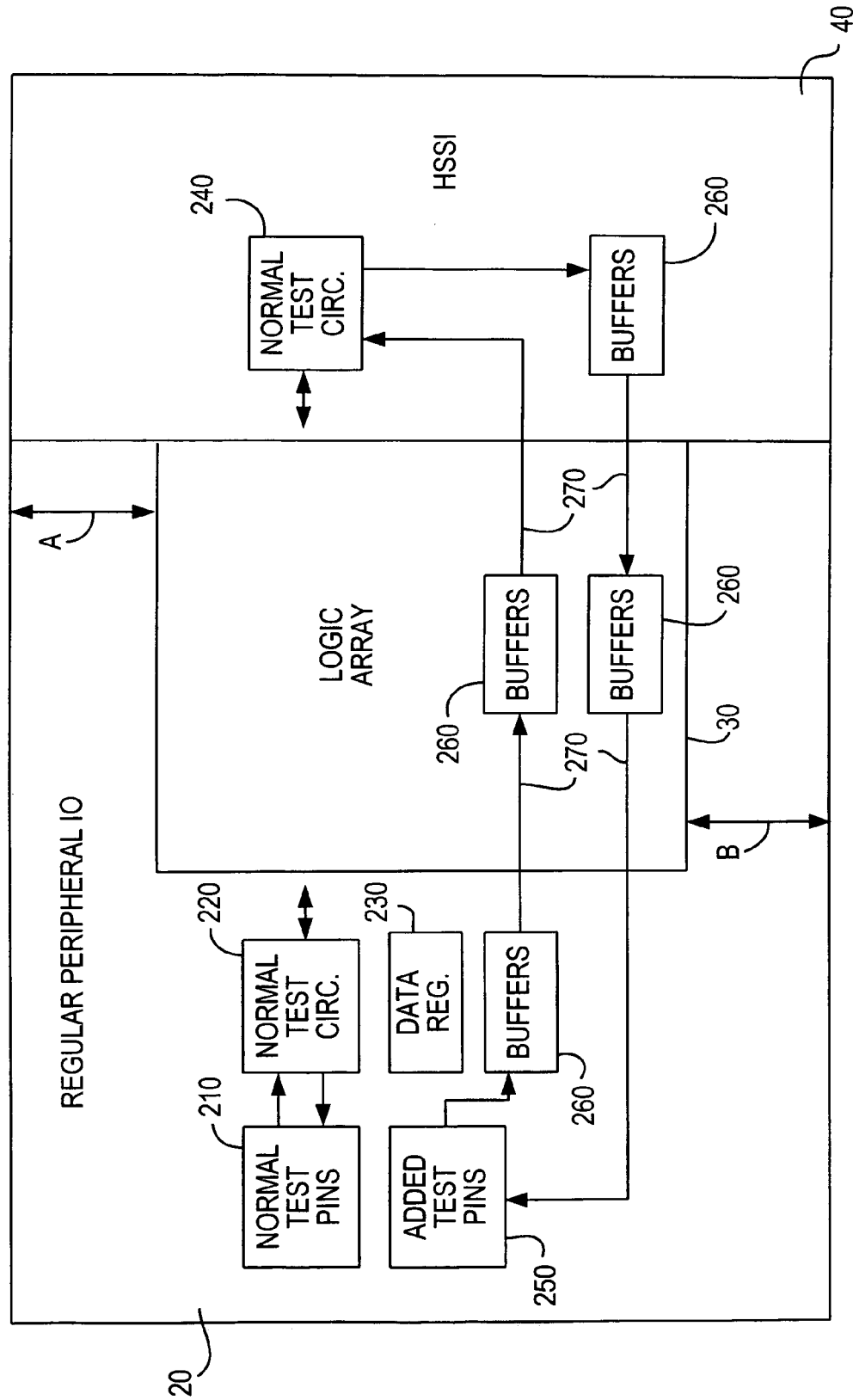
FIG. 7 is a simplified plan view of a PLD showing an illustrative embodiment of another possible aspect of the invention.

FIG. 7 shows another possible aspect of the invention that facilitates inclusion of HSSI circuitry 40 in PLD 10'. Elements 210, 220, 230, and 240 are normal components of the PLD in their approximate normal locations. For example, test pins 210 are located as usual on the left-hand side of the device to serve test circuitry 220 that is also located as usual on the left-hand side of the device. Similar test circuitry 240 is located as usual on the right-hand side of the device. However, the test pins that would normally be located on the right-hand side of the device are relocated to the left side at 250. (Most or all of test pins 210 and 250 can be normal I/O pins that are temporarily converted to test pins when testing is to be performed. This avoids a pin count increase that would result from having dedicated test pins.) To avoid running the required dedicated test connections 270 between test pins 250 and test circuitry 240 through either or both of areas A and B of the device, connections 270 are routed over logic array 30 as shown in FIG. 7. To make this possible without undue degradation of the test signals, buffers 260 are added as shown in FIG. 7. A particularly good location for some of buffers 260 (e.g., the left-most buffers 260 in FIG. 7) is in the area of normal data registers 230, which are located at or near the center of the side of the device. Other buffers 260 are provided in the middle of logic array 30.

It is desirable to avoid running the required additional test connections 270 through either area A or area B so that those added connections do not increase the vertical dimension of the device and/or upset the timing of vertical interface connections.

Figure 8:
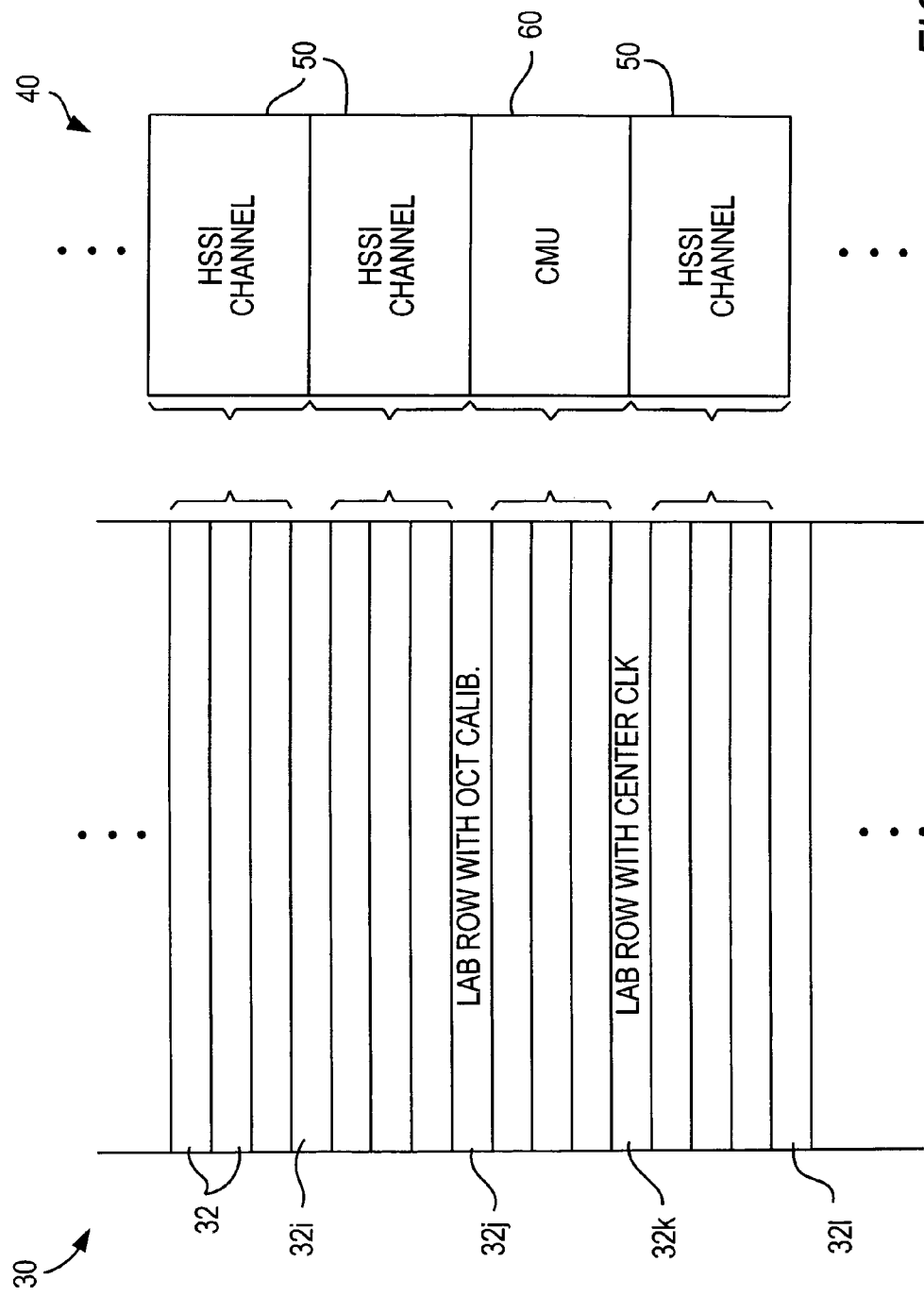
FIG. 8 is a simplified plan view of a representative portion of a PLD showing an illustrative embodiment of still another possible aspect of the invention.

FIG. 8 shows still another possible aspect of the invention that facilitates inclusion of HSSI circuitry 40 in PLD 10'. LAB rows in FIG. 8 that are numbered plain 32 or that are not numbered (to avoid over-crowding the drawing) interface with HSSI circuitry 40 (as shown, for example, in FIGS. 4 and 5). Between these LAB rows are other LAB rows like 32i, 32j, 32k, and 32l that are not thus directly involved in supporting HSSI circuitry. For this reason, these latter LAB rows are preferred choices for other special tasks such as dealing with OCT (on-chip termination) calibration control signals and/or center clock mux control signals. Thus, in accordance with this invention, these other special tasks are assigned to LAB rows like 32i, 32j, 32k, and 32l. This may involve reassignment of one or more of these special tasks from one or more other LAB rows that now interface with HSSI circuitry 40.

OCT calibration control refers to control of on-chip termination calibration. This involves possibly adjusting the electrical properties of the circuitry that receives a signal from an external source or that supplies a signal to an external destination to provide a better electrical match between device 10' and the external source or destination. For example, these signals may adjust the value of a resistor that is part of device 10' to provide better electrical matching to external devices. Center clock mux control refers to possible use of signals from within logic array 30 as local or global clock signals within the array or the like. Again, it is preferred in accordance with this invention to have LAB rows like 32i, 32j, 32k, and 32l (which are not directly involved in HSSI interface) provide these possible global or local clock signals and make the controlled selections of signals for such possible use. The same is true for OCT calibration control.

Figure 9:
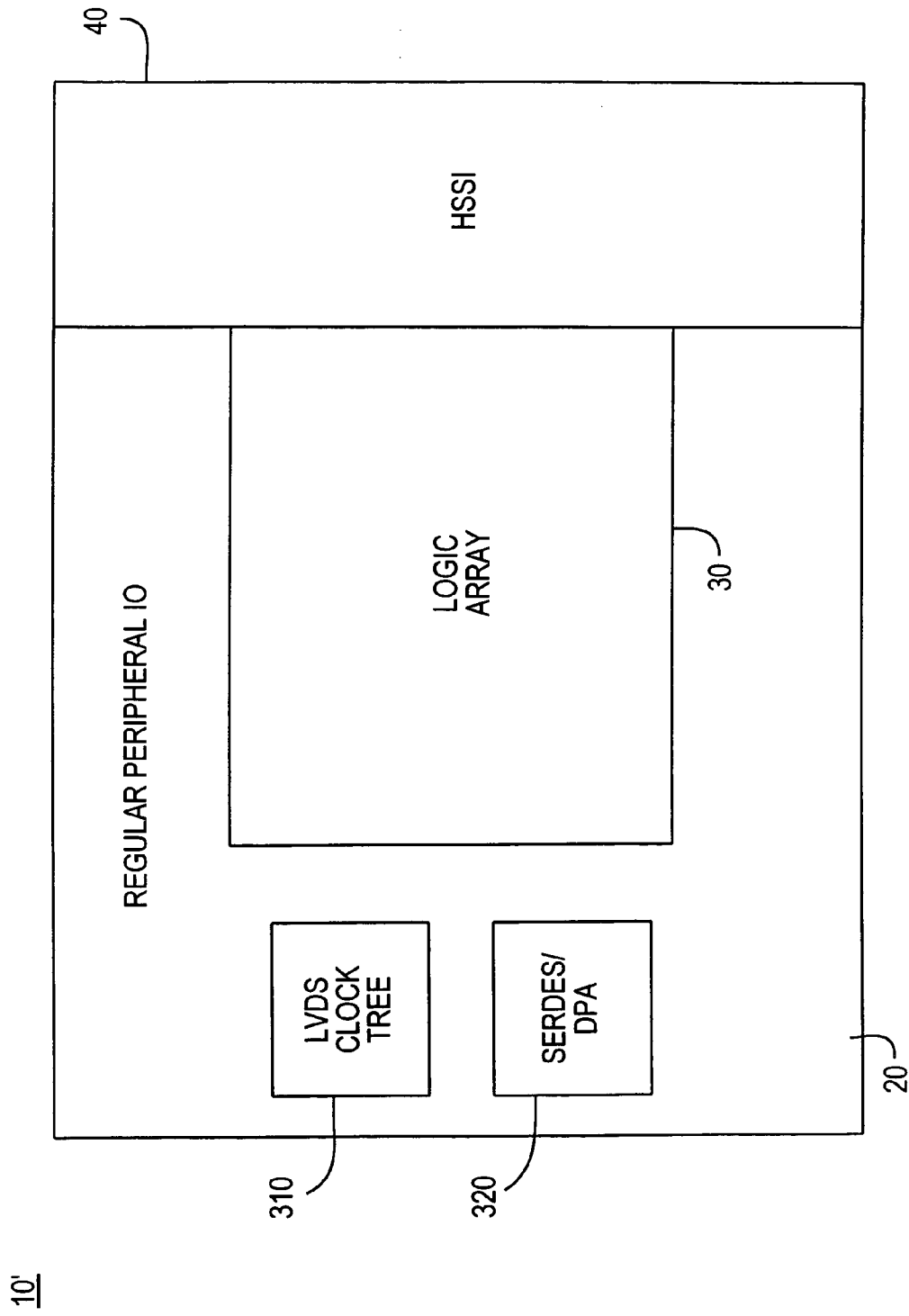
FIG. 9 is a simplified plan view of a PLD showing an illustrative embodiment of yet another possible aspect of the invention.

FIG. 9 shows yet another possible aspect of the invention that facilitates inclusion of HSSI circuitry 40 in PLD 10'. This is removal of any LVDS clock tree (like 310) and any SERDES/DPA (like 320) from the right-hand side (i.e., HSSI area 40) because there are no regular IOs on the right-hand side. One or more LVDS clock trees 310 may be provided in regular peripheral IO 20 in the usual way to help eliminate clock skew to meet LVDS (low-voltage differential signaling) standards. Similarly, one or more instance of SERDES (serializer/deserializer)/DPA (digital phase alignment) circuitry 320 may be provided in regular peripheral IO 20. But again, these types of circuitry are not needed on the right-hand side of device 10' and can accordingly be omitted or removed from that area.

Figure 10:
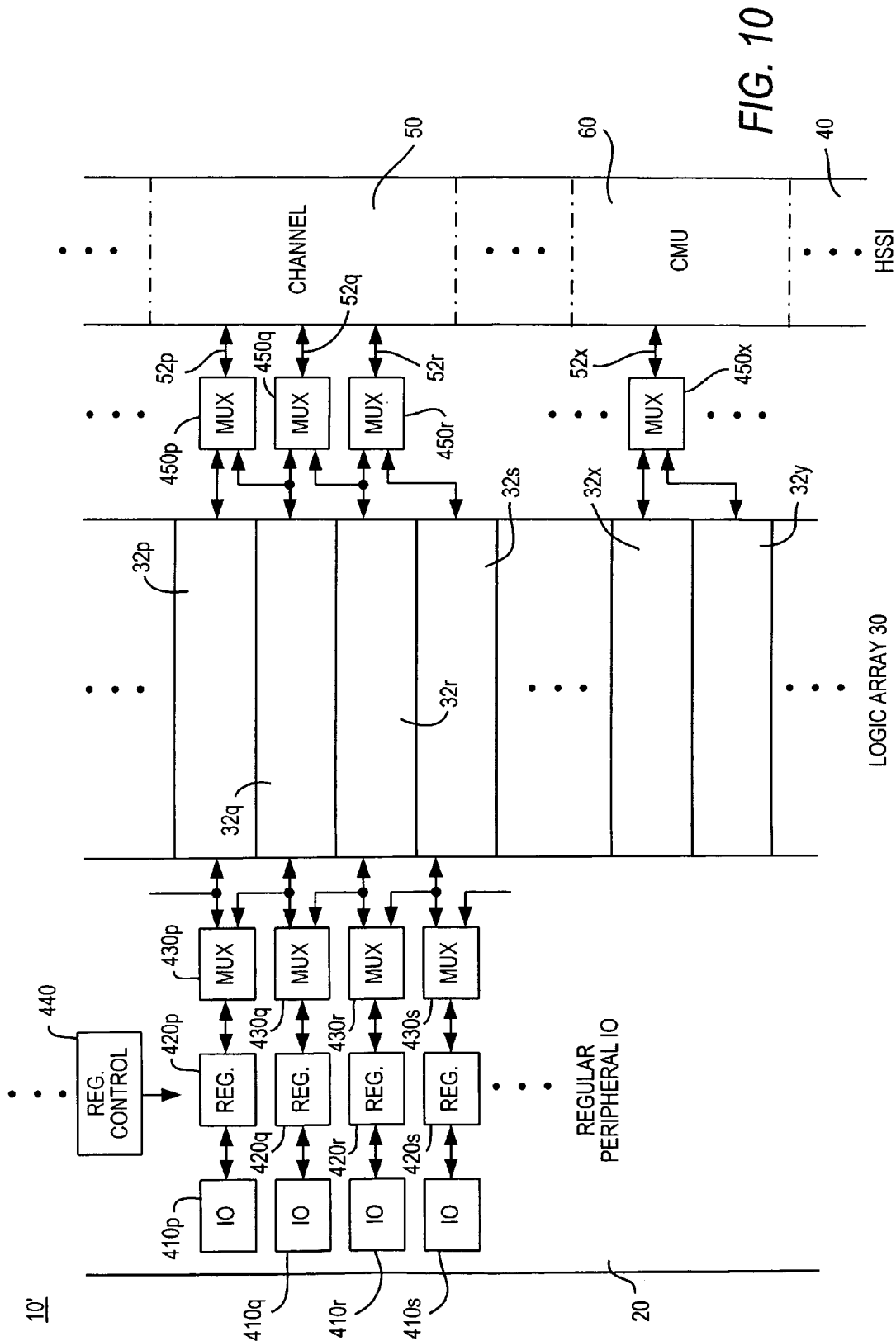
FIG. 10 is a simplified plan view of a representative portion of a PLD showing an illustrative embodiment of still another possible aspect of the invention.

FIG. 10 shows still another possible aspect of the invention that facilitates inclusion of HSSI circuitry 40 in PLD 10'. It is typical in PLDs to provide extra or spare circuitry that can be used in the event that some of the regular circuitry is found to be defective. This extra or spare circuitry is sometimes referred to as redundant circuitry. In the illustrative embodiments shown herein, one or more LAB rows 32 are such redundant circuitry. There is typically no redundancy in the IO circuitry.

Considering first the conventional left-hand side of FIG. 10, the representative circuitry shown there includes IO circuitry 410p-s, register circuitry 420p-s, multiplexer circuitry 430p-s, and register control circuitry 440. (Although not shown in FIG. 10 to avoid over-crowding the drawing, SERDES/DPA circuitry like 320 in FIG. 9 may be provided between at least some of elements 410 and 420.) The circuitry with the suffix p is nominally associated with LAB row 32p.

Similarly, the circuitry with the suffix q is nominally associated with LAB row 32q, and so on. If, however, a LAB row (e.g., 32q) is defective, multiplexers 430 can be used to effectively cut that defective LAB row out of the circuit. Multiplexer 430p continues to connect elements 410p and 420p to LAB row 32p. However, multiplexer 430q now connects elements 410q and 420q to LAB row 32r; multiplexer 430r connects elements 410r and 420r to LAB row 32s; and so on.

In accordance with the present invention, modified redundancy multiplexing 450 is provided on the right-hand side of PLD 10' to support HSSI circuitry 40. For example, LAB rows 32p-r are nominally associated with representative channel 50 in the manner shown in FIG. 4. If all of the LAB rows are operating normally, then redundancy multiplexer 450p routes channel IOs 52p to/from LAB row 32p, multiplexer 450q routes channel IOs 52q to/from LAB row 32q, and multiplexer 450r routes channel IOs 52r to/from LAB row 32r. If, however, a LAB row is defective, then it may be necessary to use some or all of multiplexers 450 to reroute some or all of channel IOs 52 to different LAB rows 32. For example, if LAB row 32q is defective (as in the example in the preceding paragraph), multiplexer 450p continues to connect IOs 52p to LAB row 32p. However, multiplexer 450q connects IOs 52q to LAB row 32r, and multiplexer 450r connects IOs 52r to LAB row 32s.

Similar redundancy multiplexing 450x is shown for representative CMU 60. Normally, multiplexer 450x connects CMU IOs 52x to LAB row 32x. But if a LAB row is defective, multiplexer 450x may instead connect CMU IOs 52x to LAB row 32y.

There are a number of differences between the new circuitry on the right in FIG. 10 and the conventional circuitry on the left. On the left, the chain of multiplexers 430 and connections between those multiplexers and logic array 30 may span relatively large numbers of LAB rows 32. On the right these chains can be much shorter (e.g., spanning only four LAB rows 32 for each channel 50 or spanning only two LAB rows for each CMU). This is possible if there are LAB rows between channels 50 and CMUs 60 that are not interfacing with those HSSI components. If there are no LAB rows between the channels 50 of a quad that are interfacing with those channels, then somewhat longer redundancy mux chains may be needed on the right. But even if that is the case, these chains do not need to span the LAB rows that are between quads 42 and that do not interface with the quads.

Another difference between the conventional circuitry on the left and the new circuitry on the right in FIG. 10 is that the new circuitry does not need registers 420 and register control circuitry 440. This so because HSSI channels 50 have their own registers.

Still another difference from left to right in FIG. 10 is that serializer/deserializer ("SERDES") and/or digital phase alignment ("DPA") circuitry that may be provided on the left (i.e., between elements 410 and 420 as mentioned earlier) can be omitted from the circuitry on the right.

It will be understood that any LAB row that may be required to interface with HSSI circuitry 40 is preferably enhanced as shown in FIG. 6 (if the feature shown in FIG. 6 is being used and if the FIG. 6 enhancement is appropriate for that row). For example, if the feature shown in FIG. 6 is being used, then all of LAB rows 32p-32s in FIG. 10 preferably include the FIG. 6 enhancement. Alternatively or in addition, if the feature shown in FIG. 8 is being used, then none of LAB rows 32p-32s or 32x-32y is preferably used as shown for LAB row 32j or 32k in FIG. 8.

Figure 11:
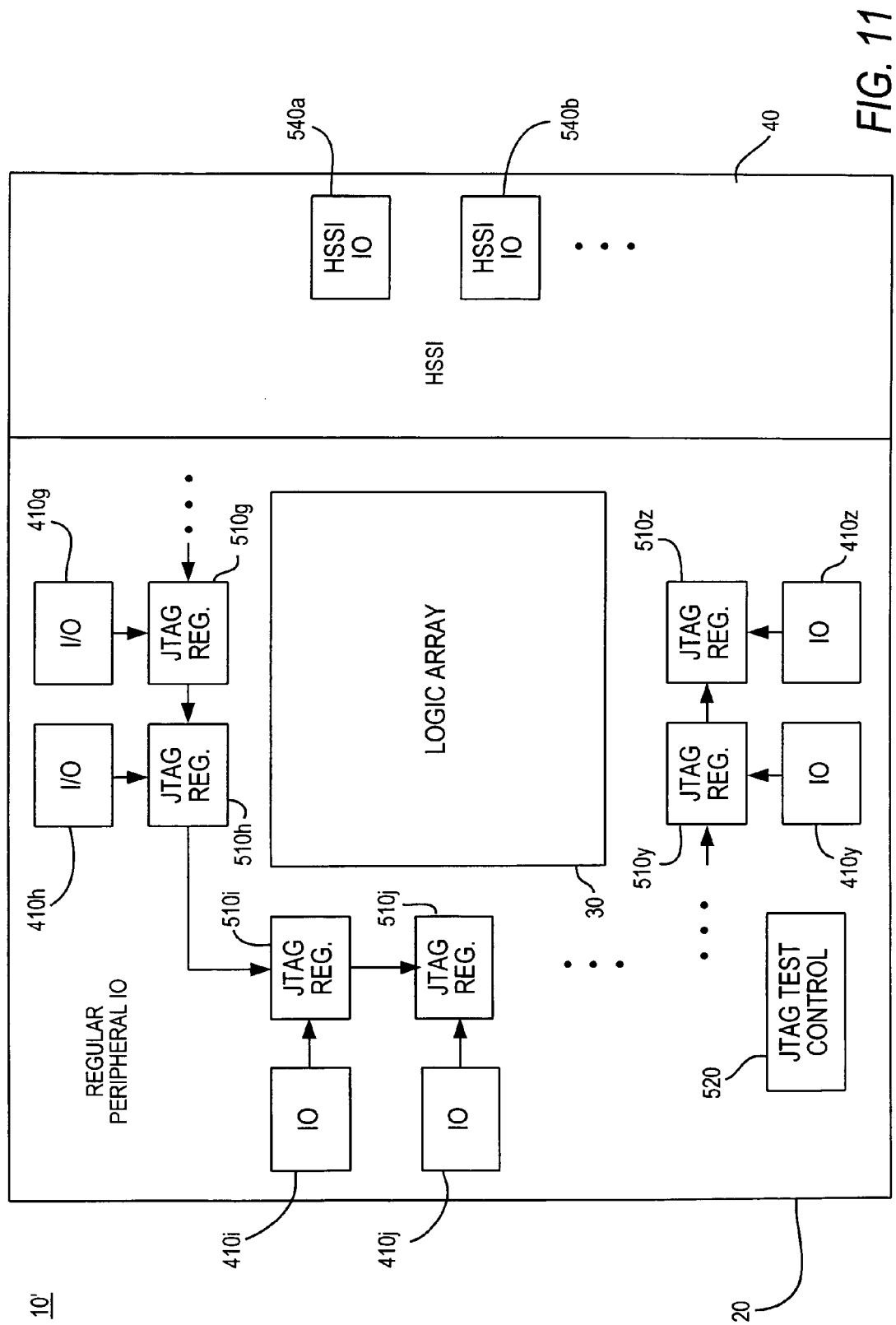
FIG. 11 is a simplified plan view of a PLD showing an illustrative embodiment of yet another possible aspect of the invention.

FIG. 11 shows yet another possible aspect of the invention that facilitates inclusion of HSSI circuitry 40 in a PLD 10'. It is typical in PLDs to provide a chain of registers that can be used by a user of the PLD to check connectivity of various integrated circuits on a printed circuit board. This is shown on the left in FIG. 11 as the chain of so-called JTAG registers 510. Each of these registers is connected to a respective one of normal IO pins 410. These registers 510 are also connected in a chain that can be tested (under control of JTAG test control circuitry 520) to determine whether each of IO pins 410 has on it the intended signal and is therefore properly connected. Such a test (scan) of these registers may be part of a so-called JTAG test of the circuitry. JTAG testing is an industry-standard type of testing.

Normally such JTAG testing would be available for all IO pins of the PLD. In accordance with this invention, however, HSSI IO pins 540 are excluded from this type of JTAG testing. Accordingly, HSSI IOs 540 do not have associated JTAG registers like 510. The chain of JTAG registers 510 does not extend to HSSI IO 540. Because the chain of registers 510 has therefore changed, the scan of those registers (controlled by control circuitry 520) is changed so as not to look for data from registers that have been omitted. In particular, control circuitry 520 would normally step through all of the IO pins of the PLD. Now, however, circuitry 520 is modified to step through only IO pins 410 and does not test for HSSI IO pins 540. Note also that removal of some IO pins (i.e., HSSI IO pins 540) requires changing the connectivity of the chain of registers 510. This chain now serves only normal IO pins 410 and does not extend to HSSI IO pins 540.

It will be understood that the foregoing is only illustrative of the principles of the invention and that various modifications can be made by those skilled in the art without departing from the scope and spirit of the invention. For example, the number of quads 42 shown in FIG. 3 is only illustrative, and that number can be more or less in other embodiments of the invention. As another example, not all of the above-described possible aspects of the invention are necessarily used in all embodiments of the invention.

For convenience in the above discussion, a particular orientation of the PLD is assumed. Thus, for example, the HSSI circuitry is assumed in the above-discussion to be on the right-hand side of the PLD. But the HSSI circuitry can instead be on any other side of the PLD (i.e., the left-hand side, the top, or the bottom). Similarly, in the above discussion it is assumed that various parts of the HSSI circuitry are served by various rows of LABs. Again, this is just an example, and if the HSSI circuitry were relocated to the top or bottom of the PLD, various columns of LABs could be used to support the various parts of the HSSI circuitry. In the appended claims, references are sometimes made to rows of LABs or the like. It will be understood that the references to rows are generic to horizontal rows and vertical columns. The orientation of the PLD is not intended to be a limitation on any possible aspect of the invention or the appended claims.

What is claimed is:

1. A programmable logic device comprising:
   logic array circuitry;
   high-speed serial interface circuitry along a first side of the logic array circuitry; and
   peripheral IO circuitry along at least one of three remaining sides of the logic array circuitry, wherein the high-speed serial interface circuitry comprises at least one group of plural channels of high-speed transceiver circuitry, each of the channels providing an interface between a high-speed serial data signal external to the device and a plurality of parallel data signals in the logic array circuitry, wherein the logic array circuitry comprises a plurality of rows of blocks of programmable logic, each of the rows also including a plurality of interconnection conductors that can be used for making connections between the blocks in that row, and wherein each of the channels interfaces with the interconnection conductors conveying the parallel data signals in a respective at least one of the rows.

2. The device defined in claim 1 wherein the peripheral IO circuitry is along all three of the remaining sides of the logic array circuitry.

3. The device defined in claim 1 wherein each of the channels interfaces with the interconnection conductors in a respective subplurality of the rows.

4. The device defined in claim 1 wherein each of the rows includes a plurality of interconnection conductor tracks extending along the row and a plurality of drivers for driving peripheral signals onto conductors in the tracks, and wherein a row that interfaces with one of the channels includes a higher number of the drivers for that interface than for interfacing with the peripheral IO circuitry.

5. The device defined in claim 4 wherein the interconnection conductors in the tracks are of various lengths, and wherein the higher number of the drivers is due to an increase in the number of drivers driving interconnection conductors that are of shortest length.

6. The device defined in claim 5 wherein the interconnection conductors that are of shortest length span four of the blocks.

7. The device defined in claim 1 further comprising:
test circuitry disposed on the first side of the logic array circuitry;
a test pin disposed on a second side of the logic array circuitry, the second side being across the logic array circuitry from the first side; and
a conductor passing over the logic array circuitry from the test pin to the test circuitry.

8. The device defined in claim 7 further comprising:
buffer circuitry for buffering a signal from the test pin to the conductor passing over the logic array circuitry.

9. The device defined in claim 1 wherein the rows that interface with the channels comprise a first subset of the rows, and wherein others of the rows do not interface with the channels and comprise a second subset of the rows.

10. The device defined in claim 9 further comprising:
on-chip termination calibration control circuitry.

11. The device defined in claim 10 wherein the on-chip termination calibration control circuitry is located in the second subset of the rows.

12. The device defined in claim 9 further comprising:
center clock circuitry for deriving a clock signal from the logic array circuitry.

13. The device defined in claim 12 wherein the center clock circuitry is located in the second subset of the rows.

14. The device defined in claim 1 further comprising:
LVDS clock tree circuitry in the peripheral IO circuitry and not along the first side of the logic array circuitry.

15. The device defined in claim 1 further comprising:
SERDES/DPA circuitry in the peripheral IO circuitry and not along the first side of the logic array circuitry.

16. The device defined in claim 1 further comprising:
redundancy multiplexer circuitry for selectively shifting interfacing of a channel with a first of the rows to interfacing of the channel with a second of the rows.

17. The device defined in claim 1 wherein the peripheral IO circuitry comprises JTAG registers connected in a chain that is scannable as part of a JTAG-controlled test.

18. The device is defined in claim 17 wherein the chain does not include any registers in the high-speed serial interface circuitry.

19. A programmable logic device comprising:
a plurality of rows of programmable logic circuitry, each of the rows including a plurality of blocks of programmable logic and a plurality of interconnection conductors that extend along the row and that can be used for making connections between the blocks in the row; and
a plurality of channels of high-speed serial transceiver circuitry disposed adjacent one end of the rows, each of the channels interfacing data between a high-speed serial data signal external to the device and a plurality of parallel data signals on the device, and each of said channels communicating the parallel data signals of that channel with the interconnection conductors of a respective subplurality of the rows, said subpluralities being collectively less than all of the rows, and at least some of the subpluralities being separated from one another by at least one row that is not in any of the subpluralities.

20. The device defined in claim 19 further comprising:
clock multiplier unit circuitry disposed adjacent said one end of the rows and communicating with one of the rows that is not in any of the subpluralities.

21. The device defined in claim 19 wherein the rows that communicate with the channels are enhanced for such communication by having more buffers for driving the interconnection conductors of those rows adjacent the channels than those rows have at their ends that are remote from the channels.

22. A programmable logic device comprising:
a plurality of rows of programmable logic circuitry, each of the rows including a plurality of blocks of programmable logic and a plurality of interconnection conductors that extend along the row and that can be used for making connections between the blocks in the row; and
a plurality of quads of high-speed serial interface circuitry disposed adjacent one end of the rows, each of the quads including a plurality of channels of high-speed serial transceiver circuitry and clock multiplier unit circuitry, each of the channels interfacing data between a high-speed serial data signal external to the device and a plurality of parallel data signals on the device, and each of said channels communicating the parallel data signals of that channel with the interconnection conductors of a respective subplurality of the rows, and each of the clock multiplier unit circuitries communicating with a respective one of the rows that is not a row that communicates with one of the channels.

* * * * *